United States Patent
Tametani et al.

(10) Patent No.: US 8,004,304 B2
(45) Date of Patent: Aug. 23, 2011

(54) SEMICONDUCTOR DEVICE, AND LIFE PREDICTION CIRCUIT AND LIFE PREDICTION METHOD FOR SEMICONDUCTOR DEVICE

(75) Inventors: Fumitaka Tametani, Tokyo (JP); Takashi Igarashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 988 days.

(21) Appl. No.: 11/543,912

(22) Filed: Oct. 6, 2006

(65) Prior Publication Data

US 2007/0296040 A1 Dec. 27, 2007

(30) Foreign Application Priority Data

Jun. 22, 2006 (JP) ................................ 2006-172280

(51) Int. Cl.
*G01R 31/26* (2006.01)
(52) U.S. Cl. ................................ 324/762.02
(58) Field of Classification Search .................. 324/765, 324/760, 158.1, 762.01–762.1, 760.01–760.02; 438/14–18; 257/48
See application file for complete search history.

(56) References Cited

U.S. PATENT DOCUMENTS

| | | | | |
|---|---|---|---|---|
| 5,493,231 A * | 2/1996 | Nicollian et al. | ............. | 324/769 |
| 5,594,349 A * | 1/1997 | Kimura | ......................... | 324/551 |
| 6,320,391 B1 * | 11/2001 | Bui | ............................... | 324/537 |
| 6,429,677 B1 * | 8/2002 | Montrose | ...................... | 324/765 |
| 6,822,437 B1 * | 11/2004 | Hau-Riege et al. | ......... | 324/158.1 |
| 7,271,608 B1 * | 9/2007 | Vermeire et al. | .............. | 324/763 |

FOREIGN PATENT DOCUMENTS

| | | |
|---|---|---|
| JP | 6-70553 | 3/1994 |
| JP | 8-51768 | 2/1996 |
| JP | 8-275586 | 10/1996 |
| WO | WO 2005/038918 A1 | 4/2005 |

OTHER PUBLICATIONS

Office Action issued Feb. 26, 2007, in German Application No. 10 2006 049 211.0-33.

* cited by examiner

*Primary Examiner* — Jermele M Hollington
*Assistant Examiner* — Tung X Nguyen
(74) *Attorney, Agent, or Firm* — Oblon, Spivak, McClelland, Maier & Neustadt, L.L.P.

(57) ABSTRACT

A life prediction wire 14 is connected to an emitter-wire bonding pad 2 of a semiconductor device 1. Wire deterioration is detected by checking whether or not an electric current flows from the life prediction wire 14 to the emitter-wire bonding pad 2. Thus, by directly checking a deterioration state of the semiconductor device, the life of the semiconductor device is predicted.

8 Claims, 3 Drawing Sheets

▨ BOBDING PAD
◆ BONDING PORTION

SEMICONDUCTOR DEVICE, AND LIFE PREDICTION CIRCUIT AND LIFE PREDICTION METHOD FOR SEMICONDUCTOR DEVICE

BACKGROUND OF THE INVENTION

The present invention relates to a semiconductor device, and life prediction circuit and life prediction method for semiconductor devices.

It is known that power semiconductor devices such as IGBTs (Insulated-Gate Bipolar Transistors) undergo cracks at their connecting portions between wire bonding pads and wires due to heat during the use or the like, eventually leading to disconnection of the wires and resulting in a failure.

Such a failure due to deterioration, and therefore the lifetime, of power semiconductor devices, as described in JP H06-070553 A, JP H08-051768 A and JP H08-275586 A, can be predicted statistically to some extent by being quantified as a function of operating time, current value, number of times of switching and the like of the semiconductor device.

Therefore, the life prediction of the prior art has been such that the use of the semiconductor is stopped when the integrated value of operating time or the like has reached a specified value.

SUMMARY OF THE INVENTION

However, the life prediction of the prior art has been uneconomical because of the necessity that the use of the semiconductor should be stopped earlier in consideration of variations among individual semiconductor devices or differences in failure occurrence time due to non-quantified conditions.

Accordingly, an object of the present invention is to provide a semiconductor device, as well as life prediction circuit and life prediction method for semiconductor devices, by which a failure occurrence due to the life of the semiconductor device can be detected in advance by directly checking the deterioration state of the semiconductor device.

In order to achieve the above object, according to the present invention, there is provided a life prediction method including:

connecting a life prediction wire to a wire bonding pad of a semiconductor device; and detecting whether or not an electric current flows from the life prediction wire to the wire bonding pad.

According to the present invention, whether or not the life prediction wire has been peeled from the wire bonding pads can be detected by passing an electric current from the life prediction wire via the wire bonding pads and the other wires to the reference (ground) potential. Consequently, since a deterioration state of the life prediction wire, which is representative of a multiplicity of wires connected to the semiconductor device, is directly checked, a deterioration state of the semiconductor device can be known correctly.

DETAILED DESCRIPTION OF THE PREFERRED EMBODIMENTS

Embodiment 1

Figure 1:
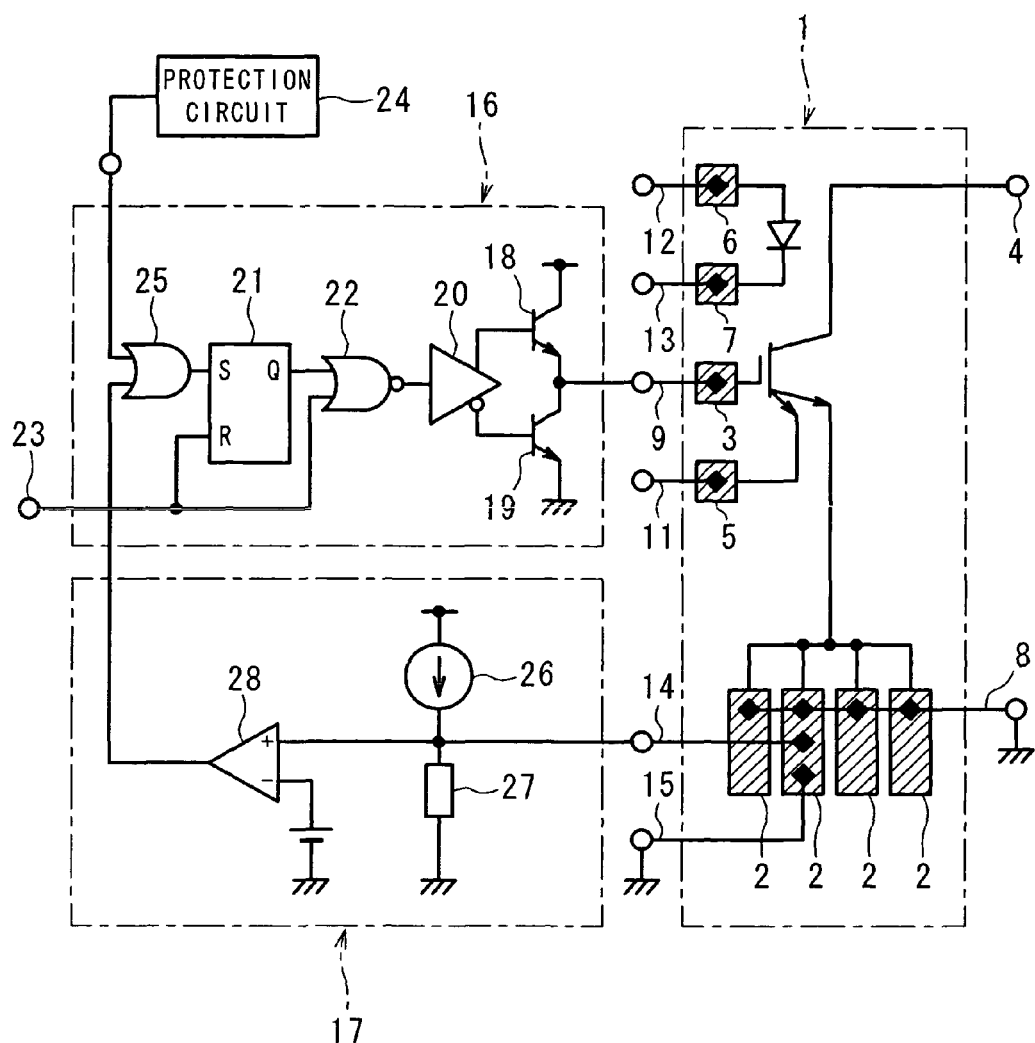
FIG. 1 is a circuit diagram of a life prediction system in a first embodiment of the present invention.
Figure 2:
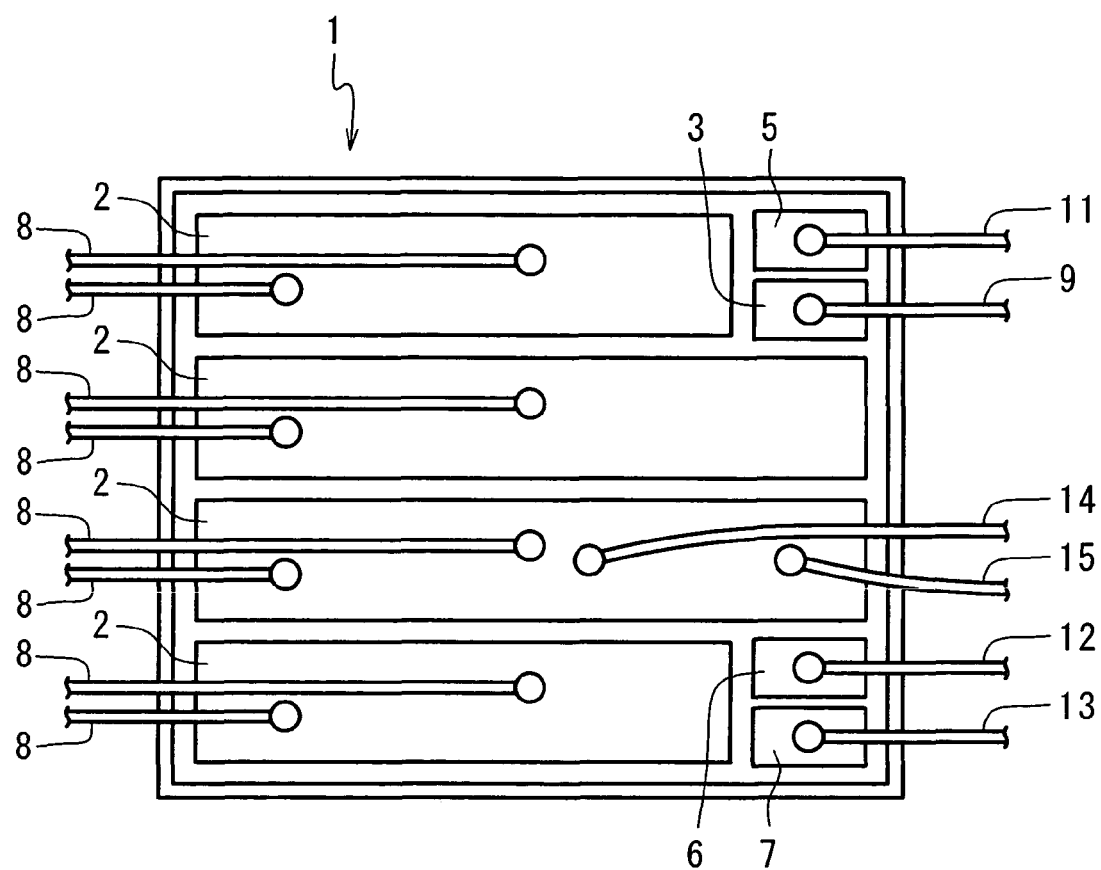
FIG. 2 is a top view of an IGBT in the system of FIG. 1.

FIG. 1 shows a life prediction system which is made up of an IGBT (Insulated-Gate Bipolar Transistor) 1 that is a semiconductor device according to a first embodiment of the present invention, a drive circuit 16 for driving the IGBT 1 based on an input signal, and a life prediction circuit 17 for detecting a lifetime of the IGBT 1. In this figure, the connecting relationship between wire bonding pads and wires of the IGBT 1 is depicted in an easier-to-understand fashion, where bonding pads which would not be expressed in ordinary circuit diagrams are shown by hatched squares, and wire bonding portions are shown by rhombic points. Also, FIG. 2 shows a top view of the IGBT 1 (chip) in the first embodiment of the invention, further clarifying the connecting relationship between the individual wire bonding pads and the individual wires in combination with FIG. 1. In this case, in the IGBT 1, four emitter-wire bonding pads 2 and a gate-wire bonding pad 3 are provided on its top surface, and a collector electrode 4 is provided on its rear surface. Also, a sense-wire bonding pad 5 for current detection use, as well as an anode-wire bonding pad 6 and a cathode-wire bonding pad 7 of a temperature-detection use diode, are further provided on the top surface of the IGBT 1.

Two emitter wires 8 are connected by means of ultrasonic bonding to the emitter-wire bonding pads 2, respectively, for extraction of output currents of the IGBT 1, and a gate wire 9 for applying a gate voltage that causes the IGBT 1 to be switched is connected to the gate-wire bonding pad 3. Also, a sense wire 11, an anode wire 12 and a cathode wire 13 are connected to the sense-wire bonding pad 5, the anode-wire bonding pad 6 and the cathode-wire bonding pad 7, respectively. Further, a life prediction wire 14 and a control emitter wire 15 are connected to one emitter-wire bonding pad 2, which can be predicted to become the highest in temperature in terms of the layout, by means of ultrasonic bonding as in the case of the wires 8. The life prediction wire 14 is connected at a generally center of the IGBT 1.

In addition, the control emitter wire 15, which is provided independent of the wire for use of extraction of output signals (currents) of the IGBT 1, is ordinarily connected to a reference (ground) potential on the drive circuit 16 side so that a reference potential of the drive circuit output stage and an emitter potential of the IGBT 1 are equalized to each other. Also, although the control emitter wire 15 is connected to one emitter-wire bonding pads 2 shared with the life prediction wire 14, yet it may also be connected to another emitter-wire bonding pad 2.

For makeup of a power module with the IGBT 1, for example, the IGBT 1 is placed on a board, and the collector electrode 4 on the rear side of the IGBT 1 and interconnection patterns or the like provided on the board are soldered together, by which the wire bonding pads 2, 3, 5, 6, 7 on the surface and, for example, on-board interconnections or other element devices or cased electrodes or the like are connected to each other by means of the wires 8, 9, 11, 12, 13, 14, 15, respectively.

The drive circuit 16 has a turn-on transistor 18 for applying a voltage to the gate of the IGBT 1, and a turn-off transistor 19 for setting the gate to the reference (ground) potential. The turn-on transistor 18 and the turn-off transistor 19 receive a noninverted (normal) output and an inverted output of an amplifier 20, respectively, as their inputs, where only either one of the transistors is turned on. Operation of the transistor is controlled by a signal inputted to a logic circuit which is composed of an RS flip-flop 21 and a NOR gate 22. In the drive circuit 16, since a Low (L) level signal is given to an S (set) terminal input of the RS flip-flop 21 in its normal drive operation, the output of the drive circuit 16 changes based on an input signal at an input terminal 23. That is, as the signal level of the input terminal 23 goes from High (H) to L level, the output of the NOR gate 22 goes 'H', making the turn-on transistor 18 held in an ON state to apply a high-potential gate voltage which is equal to or higher than the threshold value of the IGBT 1, by which the IGBT 1 is turned on. Conversely, when the signal level of the input terminal 23 goes from 'L' to 'H', the output of the NOR gate 22 goes 'L', making the turn-off transistor 19 held in an ON state to apply a lower-potential gate voltage, by which the IGBT 1 is turned off. Also, in the drive circuit 16, which has a shutoff (device protection) operation function based on signals derived from an external protection circuit 24 and the life prediction circuit 17, when an 'H' input comes to an OR gate 25 from at least either one of the life prediction circuit 17 and the external protection circuit 24, an 'H' signal is given to the S terminal input of the RS flip-flop 21, where if the IGBT 1 is in a turn-on state, the turn-off transistor 19 is immediately turned on, bringing the gate to the reference (ground) potential, by which the IGBT 1 is turned off. It is noted that the external protection circuit 24 serves for, for example, overcurrent protection, short-circuit current protection, control power voltage reduction protection, overheating protection or the like, where when any one of these statuses to be protected is detected, an 'H' signal is transmitted from the protection circuit 24 to the drive circuit 16.

The life prediction circuit 17 has a constant current circuit 26 which is to be connected to the life prediction wire 14 so as to be able to feed a constant current to the life prediction wire 14, a detection resistor 27 connected between the constant current circuit 26 and the reference (ground) potential (i.e., between the life prediction wire 14 and the reference (ground) potential), and a comparator 28. The comparator 28 is connected in such a way that a detection reference voltage is to be inputted to an inverted (−) input of the comparator 28 while a potential of the life prediction wire 14 connected to the constant current circuit 26 (i.e., a potential of the detection resistor 27 connected to the constant current circuit 26) is to be inputted to a noninverted (+) input, where the comparator 28 outputs a signal based on a result of comparison of these two inputs. Then, an output of the comparator 28 is inputted to the drive circuit 16.

In such a circuit construction as shown above, when a high voltage not less than the threshold value is applied to the gate-wire bonding pad 3 via the gate wire 9, the IGBT 1 is turned on and enabled to pass a large current from the collector to the emitter. That is, the IGBT 1, when turned on, has an emitter current flow out from the emitter-wire bonding pads 2 to the emitter wires 8.

The IGBT 1, upon each operation, undergoes heat generation due to the emitter current, so that connecting portions between the wire bonding pads 2, 3, 5, 6, 7 and the wires 8, 9, 11, 12, 13, 14, 15 are repetitively exposed to high temperatures. The connecting portions (bonding portions) of the wires 8, 9, 11, 12, 13, 14, 15 are deteriorated due to heat and, when repetitively subjected to thermal stress, lead to occurrence of cracks at the ultrasonic-bonded connecting portions as well as at the wires themselves in their neighborhoods. The wires 8, 9, 11, 12, 13, 14, 15, when further deteriorated, finally lead to peeling from the wire bonding pads 2, 3, 5, 6, 7 or breaks of the wires, so that the IGBT 1 is functionally impaired, reaching the end of its life. In particular, neighborhoods of the center of the IGBT 1, which are less heat-dissipative and therefore more high temperature-prone, are predicted to undergo the deterioration of the life prediction wire 14 earliest.

In this embodiment, the life prediction wire 14 is connected to one emitter-wire bonding pad 2 independent of wires serving for outputting the output current, and the life prediction circuit 17 passes the current, which is derived from the constant current circuit 26, from the life prediction wire 14 to the reference (ground) potential via the emitter-wire bonding pads 2 and the other wires connected to the emitter-wire bonding pads 2 (emitter wires 8 and control emitter wire 15). In a state that the IGBT 1 is not deteriorated, there is generally no electric resistance in the route leading from the life prediction wire 14 to the reference (ground) potential via the emitter-wire bonding pads 2 and the other wires connected to the emitter-wire bonding pads 2 (emitter wires 8 and control emitter wire 15), while there is no current that flows via the detection resistor 27 connected in parallel. Therefore, there occurs no voltage drop in the route leading from the life prediction wire 14 to the reference (ground) potential, so that the potential of the life prediction wire 14 is zero (ground level).

However, as a result of using the IGBT 1, there occur cracks to bonding portions of the life prediction wire 14 or the life prediction wire 14 itself in neighborhoods of the bonding portions, which eventually lead to peeling of the life prediction wire 14 from the emitter-wire bonding pads 2 or breaks of the life prediction wire 14. Then, it becomes impossible for the current derived from the constant current circuit 26 to flow through the emitter-wire bonding pads 2, so that a voltage drop occurs at the detection resistor 27, causing the potential at the non-inverted input of the comparator 28 to rise.

Whereas the potential of the life prediction wire 14 is compared with the detection reference voltage at the inverted input by the comparator 28, the detection reference voltage is lower than a potential which appears to the detection resistor 27 when the life prediction wire 14 has yielded to the peeling from the emitter-wire bonding pads 2 or break of itself so as to come to an electrically open state. That is, when the life prediction wire 14 has yielded to the peeling from the emitter-wire bonding pads 2 or break of itself, the comparator 28 issues an 'H' level of the detection signal to the drive circuit 16, thereby making the IGBT 1 turned off.

In this embodiment, the life prediction wire 14 is connected at a generally center of the IGBT 1 as described before, and therefore subject to larger thermal stresses, as compared with the wires 8, 9, 11, 12, 13, 15 connected at vicinities of the periphery of the IGBT 1. Because of this, the life prediction wire 14 is under such a condition that it is more liable to earlier deterioration and the peeling from the emitter-wire bonding pads 2 before the other wires 8, 9, 11, 12, 13, 15 are peeled from the wire bonding pads 2, 3, 5, 6, 7 so that the IGBT 1 results in malfunction. That is, the life prediction circuit 17 is enabled to check deterioration of the life prediction wire 14 and thereby detect occurrence of any failure due to the lifetime of the IGBT 1.

In this case, although part of the emitter wires 8 is also connected to central portion of the IGBT 1 as in the case of the life prediction wire 14, the emitter wires 8 are connected in such a large number of quantity that only peeling of part of those emitter wires 8 from the emitter-wire bonding pads 2 does not lead to functional impairment of the IGBT 1.

For makeup of a power module with the IGBT 1, the power module package may appropriately be implemented with the drive circuit 16 and the life prediction circuit 17 or part of them included therein.

Embodiment 2

Figure 3:
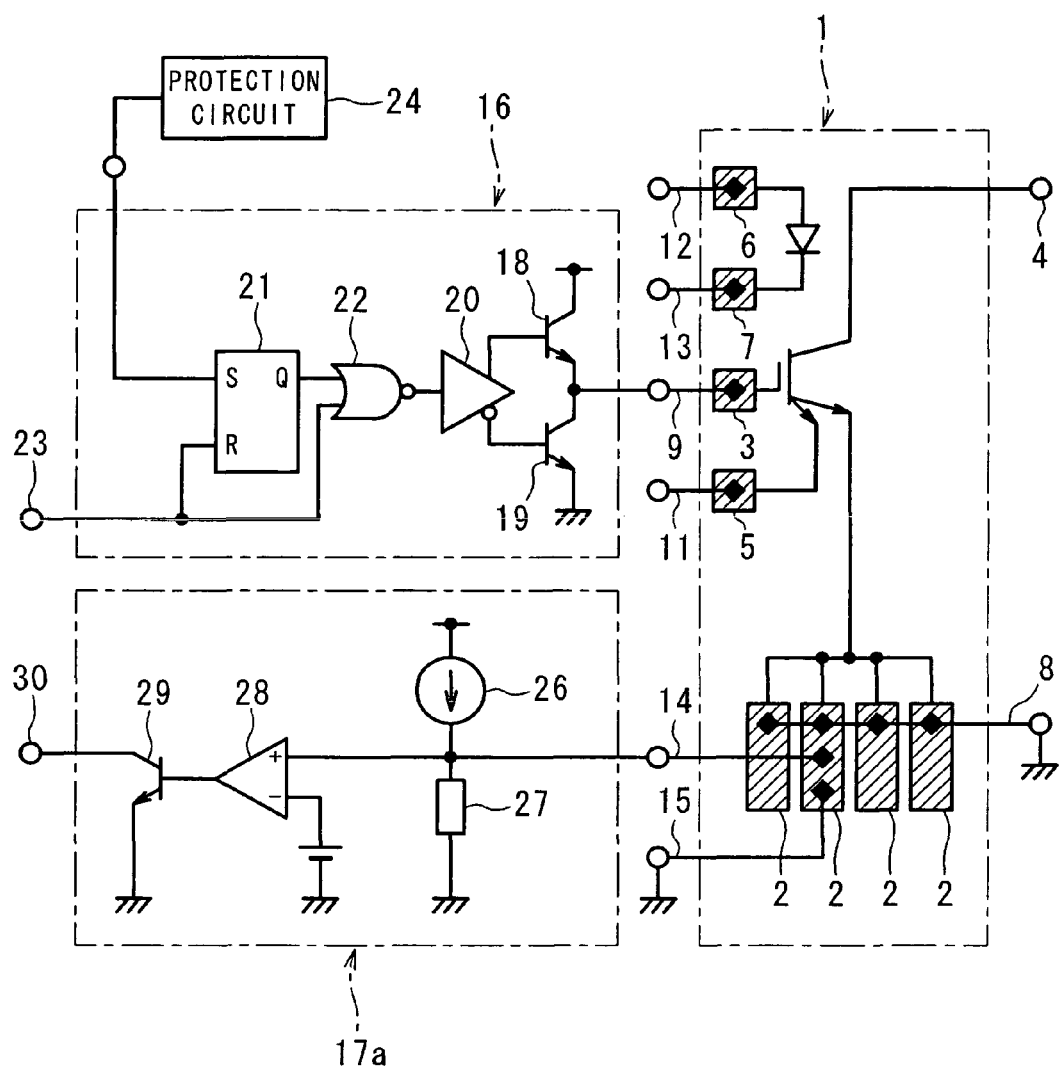
FIG. 3 is a circuit diagram of an alternative of the life prediction system of FIG. 1.

FIG. 3 shows a life prediction circuit 17a which is an alternative of the life prediction circuit 17 of the first embodiment. In the life prediction circuit 17a, a voltage drop of the detection resistor 27 is detected by the comparator 28, and a transistor 29 is switched by a detection signal of the comparator 28, by which an alarm signal is outputted to an alarm terminal 30.

In this case, it becomes practicable to inform a user of an approach to the end of life without abruptly halting the operation of the IGBT 1. As a result of this, the user is enabled to keep device maintenance without abruptly halting the equipment.

The invention claimed is:

1. A life prediction method comprising:
connecting a life prediction wire to a wire bonding pad of a semiconductor device at a connecting portion;
supplying an electric current to the life prediction wire from a constant current circuit; and
detecting whether or not the electric current flows from the life prediction wire to the wire bonding pad and predicting a deterioration state of the semiconductor device based on a result of the detecting, wherein detecting that the electric current no longer flows from the life prediction wire to the wire bonding pad indicates that the life prediction wire is disconnected at the connecting portion.

2. A semiconductor device comprising:
a life prediction wire connected to a wire bonding pad of the semiconductor device at a connecting portion, wherein
deterioration of the semiconductor device is predicted based on deterioration of the life prediction wire,
the deterioration of the semiconductor device leads to disconnection of the life prediction wire from the wire bonding pad at the connecting portion, and
the disconnection is determined by detecting whether or not electric current being supplied to the life prediction wire from a constant current circuit flows from the life prediction wire to the wire bonding pad.

3. A life prediction circuit for a semiconductor device, comprising:
a life prediction wire connected to a wire bonding pad of a semiconductor device; and
a constant current circuit configured to continuously supply a specific current to the life prediction wire, the current being passed from the life prediction wire to the wire bonding pad to a reference potential via the wire bonding pad to detect a potential of the life prediction wire.

4. The life prediction circuit according to claim 3, further comprising:
a detection resistor connected between the life prediction wire and the reference potential, wherein the current from the constant current circuit flows through the resistor and generates a voltage across the resistor when the wire bonding pad of the semiconductor device is in a deteriorated state.

5. The life prediction circuit according to claim 4, further comprising:
a transistor configured to be switched by a voltage generated across the detection resistor to output an alarm signal.

6. The life prediction method according to claim 1, further comprising:
connecting the constant current circuit to a resistor that conducts electric current from the constant current circuit when the wire bonding pad of the semiconductor device is in a deterioration state, wherein
the detecting includes detecting a voltage on the resistor.

7. The life prediction circuit according to claim 3, wherein
the reference potential is supplied by a wire connected directly to the wire bonding pad,
the current passes from the life prediction wire to the wire bonding pad to the wire, and
the potential of the life prediction wire is determined by the current flowing from a connection point of the life prediction wire and the wire bonding pad to a connection point of the wire and the wire bonding pad.

8. The semiconductor device according to claim 2, wherein the life prediction wire is connected to a central portion of the wire bonding pad, an emitter wire is connected to one end of the wire bonding pad, and a control-emitter wire is connected to an other end of the wire bonding pad.

* * * * *